US007722392B2

(12) United States Patent
Lee et al.

(10) Patent No.: US 7,722,392 B2
(45) Date of Patent: May 25, 2010

(54) EXPENDABLE ELECTRICAL CONNECTOR

(75) Inventors: Kuo-Chi Lee, Taipei County (TW);
Chin-Huang Lin, Taipei County (TW)

(73) Assignee: Dragonstate Technology Co., Ltd., Taipei (TW)

( * ) Notice: Subject to any disclaimer, the term of this patent is extended or adjusted under 35 U.S.C. 154(b) by 0 days.

(21) Appl. No.: 12/128,946

(22) Filed: May 29, 2008

(65) Prior Publication Data

US 2009/0257202 A1 Oct. 15, 2009

(30) Foreign Application Priority Data

Apr. 14, 2008 (TW) .............................. 97206331 U

(51) Int. Cl.
*H01R 13/73* (2006.01)

(52) U.S. Cl. ............................... 439/540.1; 439/607.26

(58) Field of Classification Search ............... 439/540.1, 439/676, 701, 541.5, 607.26
See application file for complete search history.

(56) References Cited

U.S. PATENT DOCUMENTS

| 6,179,650 | B1 * | 1/2001 | Chih-Kai ................. 439/540.1 |
| 6,945,828 | B2 * | 9/2005 | Kamei et al. ................. 439/717 |
| 7,094,095 | B1 * | 8/2006 | Caveney .................. 439/540.1 |
| 7,367,850 | B1 * | 5/2008 | Chang .......................... 439/676 |
| 2002/0182941 | A1 * | 12/2002 | Okabe et al. ................. 439/701 |
| 2004/0209515 | A1 * | 10/2004 | Caveney et al. .......... 439/540.1 |
| 2008/0102699 | A1 * | 5/2008 | Chen .......................... 439/607 |

* cited by examiner

*Primary Examiner*—Hien Vu
(74) *Attorney, Agent, or Firm*—Rosenberg, Klein & Lee

(57) ABSTRACT

An expendable electrical connector uses a plurality of modular housings sequentially assembled for receiving receptacle assemblies. The expendable electrical connector does not use dedicated moulds for different numbers of the receptacle assemblies and cost is decreased. Two neighboring modular housings share a side plate so that total length of the expendable electrical connector will be shortened and cost will also be decreased. Each of the modular housings may be made from a metallic sheet by punching process, and used to cover each of the receptacle assemblies and the modular housings can be connected with each other. The modular housings provide a good performance of grounding and shielding electromagnetic interference without dedicated grounding steps for individual receptacle assemblies.

17 Claims, 9 Drawing Sheets

EXPENDABLE ELECTRICAL CONNECTOR

BACKGROUND OF THE INVENTION

1. Field of the Invention

The present invention relates to an expendable electrical connector, and in particular to an electrical connector which is consisted of a plurality of modular housings sequentially for receiving receptacle assemblies. Two neighboring modular housings share a side plate so that total length of the expendable electrical connector will be shortened.

2. Description of Related Art

Hubs or fabric switches in prior art are usually electrical connectors having a plurality of receptacles, and have a housing with a plurality receiving spaces. The receptacles are respectively positioned within corresponding receiving spaces. In addition, the housing is usually made of plastic, and a mould which is used to manufacturer the housing is dedicated to number of receptacles. Thus, cost is increased and total length of the electrical connectors is lengthened due to separation between neighboring housings.

The receptacles need a metallic housing to cover an insulation body, and the metallic housing is used to shield electromagnetic wave or grounded. The receptacles are separately positioned within the housing and grounded, and the insulation body is covered at least four side plates so that cost is increased.

Thus, there is a need for an expendable electrical connector to overcome above disadvantages.

SUMMARY OF THE INVENTION

It is an object of the present invention to provide an expendable electrical connector which is consisted of a plurality of modular housings in series for receiving receptacle assemblies. Two neighboring modular housings share or do not use a side plate so that total length of the expendable electrical connector will be shortened.

To achieve the object of the present invention, it provides an expendable electrical connector including a plurality of modular housings which are sequentially positioned along an assembling direction. Each of the modular housings includes an attachment plate, a first side plate, and a second side plate, and the second side plate and the second side plate respectively extend from the attachment plate toward a first end and a second end along the assembling direction. Thus, an assembly opening is defined by the first end and the second end, and the attachment plate of another modular housing is assembled with the assembly opening of the modular housing.

It is another object of the present invention to provide an expendable electrical connector including a plurality of modular housings which are sequentially positioned along an assembling direction. Each of the modular housings includes an attachment plate, a first side plate, and a second side plate, and the first side plate and the second side plate respectively extend from the attachment plate along the direction of extension. A receiving space of the attachment plate is defined by the first side plate and the second side plate, and the receiving spaces of the modular housings are in communication with each other. Each of the modular housings may be made from a metallic sheet by punching process.

Advantage of the present invention is that a plurality of modular housing are sequentially assembled for receiving receptacle assemblies. The present invention does not use dedicated moulds for different numbers of the receptacle assemblies and cost is decreased. Two neighboring modular housings share a side plate so that total length of the expendable electrical connector will be shortened and cost of modular housings will also be decreased. Each of the modular housings may be made from a metallic sheet by punching process, and used to cover each of the receptacle assemblies and the modular housings can be connected with each other. The modular housings of the present invention provides a good performance of grounding and shielding electromagnetic interference without dedicated grounding steps for individual receptacle assemblies.

BRIEF DESCRIPTION OF THE DRAWINGS

The present invention can be fully understood from the following detailed description and preferred embodiment with reference to the accompanying drawings, in which.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Figure 1:
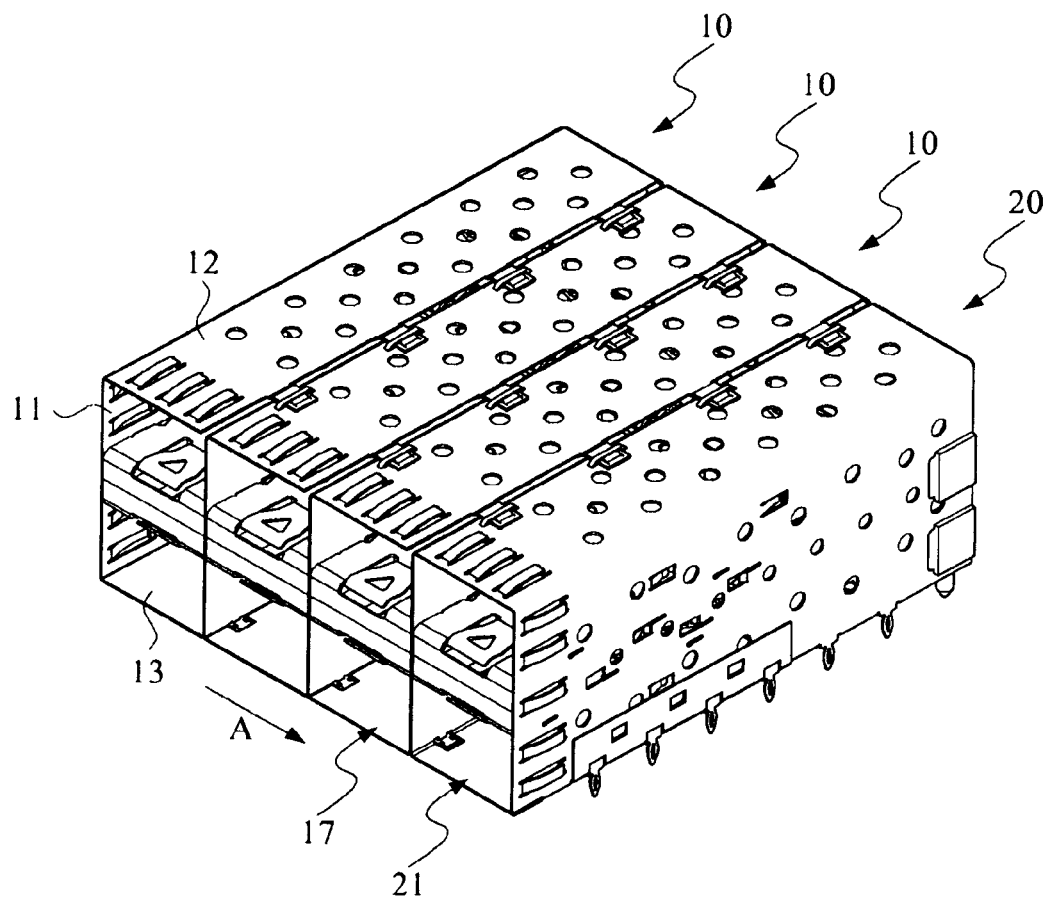
FIG. 1 is a perspective view of an expendable electrical connector of the first embodiment according to the present invention.
Figure 2:
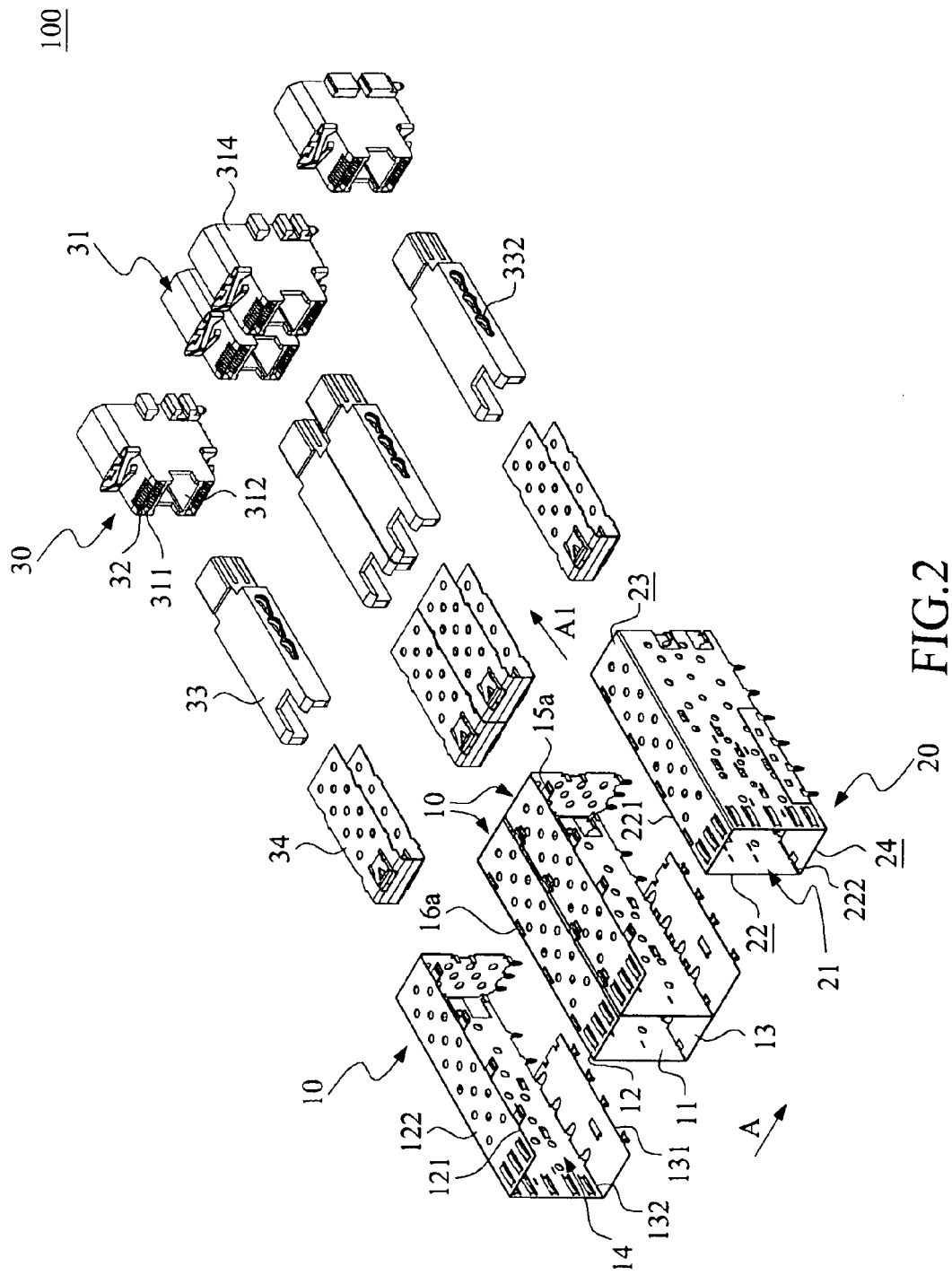
FIG. 2 is an exploded view of an expendable electrical connector of the first embodiment according to the present invention.

Referring to FIGS. 1 and 2, FIG. 1 illustrates a perspective view of an expendable electrical connector 100 of the first embodiment according to the present invention. FIG. 2 illustrates an exploded view of an expendable electrical connector 100 of the first embodiment according to the present invention. The expendable electrical connector 100 such as hub or fabric switch has a plurality of ports or receptacles and has a plurality of modular housings 10, a base housing 20 and a plurality of receptacle assemblies 30.

The modular housings 10 are sequentially assembled along an assembling direction A, and are made of metallic plate by punching process. Each of the modular housings 10 includes an attachment plate 11, a first side plate 12, and a second side plate 13, and the first side plate 12 extends from the attachment plate 11 toward a first end 121 along the assembling direction A. In this light, cross-sections of the modular housings 10 are C-shaped. The second side plate 13 extends from the attachment plate 11 toward a second end 131 along the assembling direction A. Both the first side plate 12 and the second side plate 13 may be perpendicular to the attachment plate 11.

An assembly opening 14 is defined by the first end 121 and the second end 131, and the attachment plate 11 of another one of the modular housings 10 is assembled with the assembly opening 14 of one of the modular housings 10. The modular housing 10 including the attachment plate 11, the first side plate 12 and the second side plate 13 is assembled with the attachment plate 11 of another one of the modular housings 10 so that a hollow rectangular prism is formed for receiving the receptacle assemblies 30.

Neighboring modular housings 10 share the attachment plate 11 so that total length of the expendable electrical connector 100 will be shortened and cost of modular housings 10 will also be decreased. Each of the modular housings 10 may be used to cover each of the receptacle assemblies and connected with each other. The modular housings of the present invention provide a good performance of grounding and shielding electromagnetic interference without dedicated grounding steps for individual receptacle assemblies.

The base housing 20 is hollow rectangular prism and made of metallic sheet by punching process. The base housing 20 is assembled with the modular housings 10 along the assembling direction A and has a receptacle socket 21 for receiving a corresponding connectors (not shown) or plugs (not shown) along an inserting direction A1. The corresponding connectors can be SPF (Small Form Pluggable) connectors, and the base housing 20 has a attachment surface 22, a top surface 23 and a bottom surface 24. Both the top surface 23 and the bottom surface 24 respectively extend from the attachment surface 22 along the assembling direction A. The attachment surface 22 is attached to an opening of the modular housing 10, and the attachment surface 22 of the base housing 20 and the attachment plate 11, the first side plate 12 and the second side plate 13 of the modular housing 10 are assembled so that a hollow rectangular prism with receptacle socket 21 or 17 is formed for receiving the receptacle assemblies 30.

The receptacle assemblies 30 are respectively positioned within the base housings 20 and the modular housings 10. When the receptacle assemblies 30 are sequentially assembled within the modular housings 10, the receptacle assemblies 30 are also sequentially assembled along the assembling direction A. Each of the receptacle assemblies 30 also includes an insulation body 31, a plurality of terminals 32, a division element 33 and a separation housing 34. The insulation body 31 includes a plurality of slots 311 and at least one retention groove 312. The slots 311 is used to receive corresponding plugs or connectors, and the terminals 32 are positioned at the insulation body 31 and expose from the slots 311 so as to electrically connect corresponding parts of the corresponding plugs or connectors. One end of the division element 33 is assembled within the retention grooves 312 along the assembling direction A1 so as to separate the slots 311. The separation housing 34 is used to cover the division element 33 and made of metallic plate by punching process so as to shield electromagnetic interference and provide grounding.

According to another embodiment of the present invention, if there is only one slot 311 in the insulation body 31, then the division element 33 and the separation housing 34 are omitted.

Figure 3:
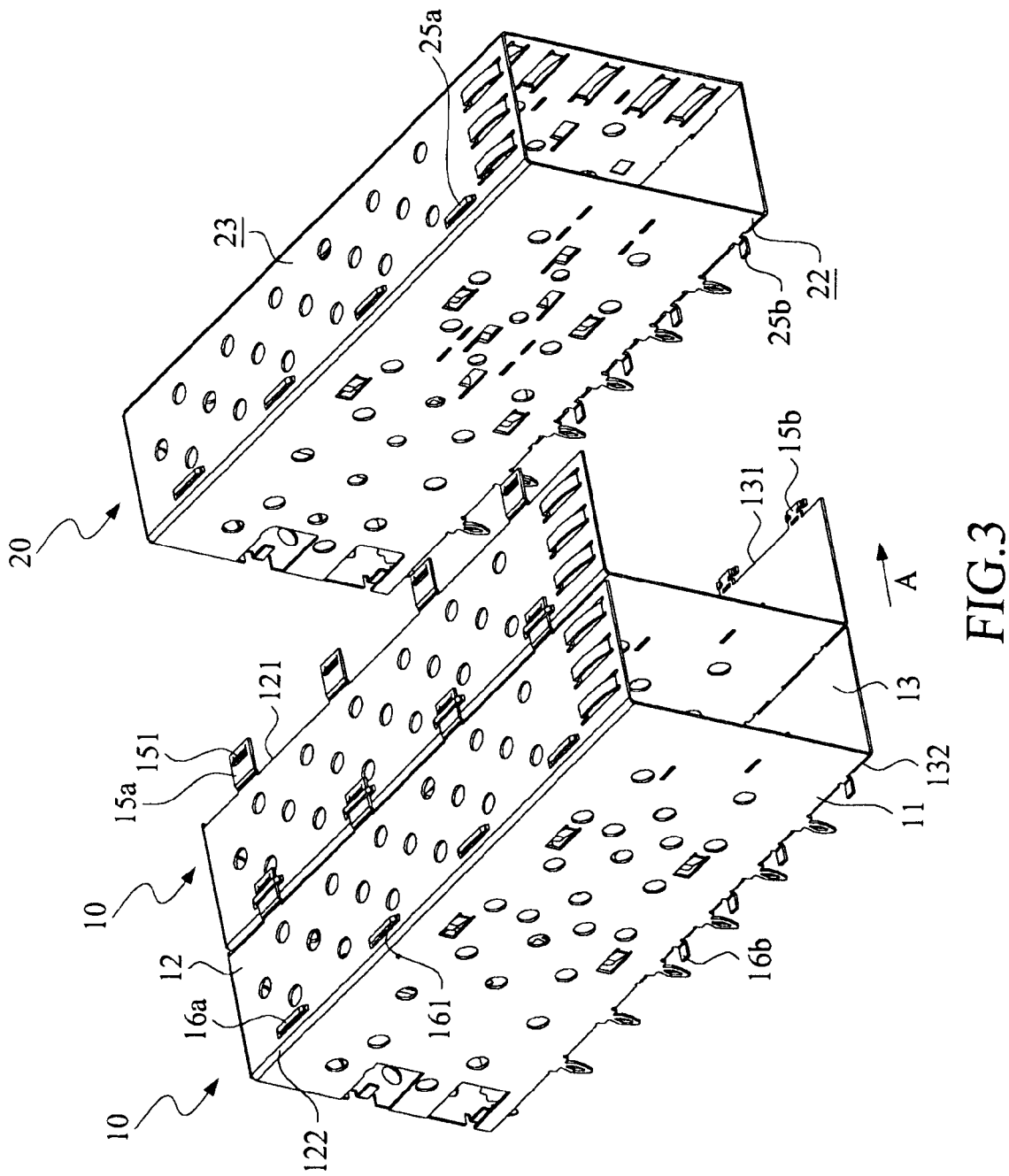
FIG. 3 is a partly exploded view of an expendable electrical connector according to the present invention.
Figure 4:
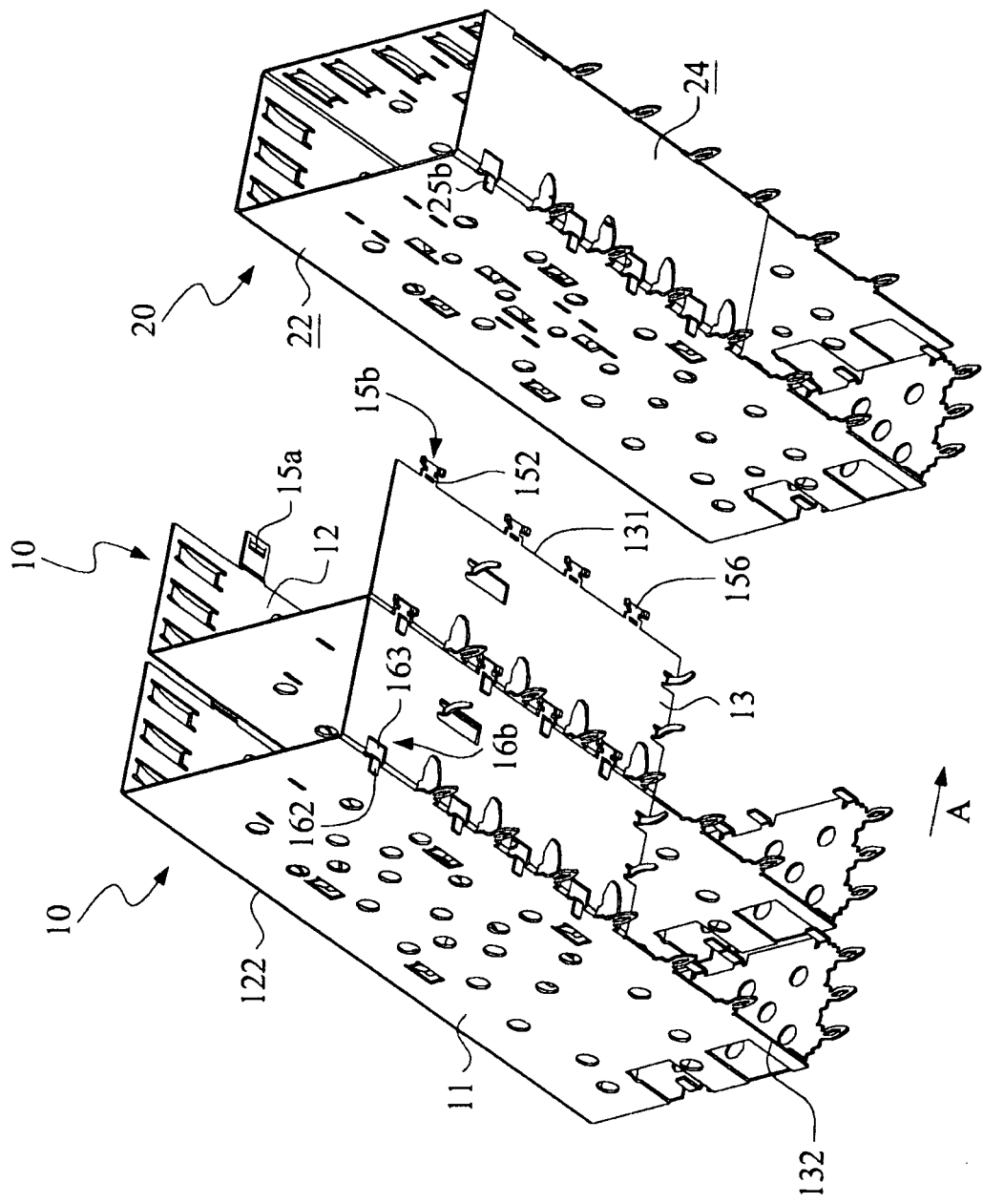
FIG. 4 is another partly exploded view of an expendable electrical connector according to the present invention.

Referring to FIGS. 3 and 4, FIG. 3 illustrates partly exploded view of modular housing 10 and the base housing 20 according to the present invention. FIG. 4 illustrates another partly exploded view of FIG. 3. The first side plate 12 of the modular housing 10 has a first assembly edge 122 which is in proximity to the portion where the attachment plate 11 and the first side plate 12 are assembled. The second side plate 13 of the modular housing 10 has a second assembly edge 132 which is in proximity to the portion where the attachment plate 11 and the second side plate 13 are assembled.

The modular housing 10 has a plurality of clips 15a, 15b and a plurality of hook structures 16a, 16b. The clips 15a, 15b of one of the modular housings 10 are used to hook over the hook structures 16a, 16b of another one of the modular housings 10. The clips 15a, 15b are respectively positioned in proximity to the first end 121 and the second end 131, and the hook structures 16a, 16b are positioned in proximity to the first assembly edge 122 and the second assembly edge 132.

The base housing 20 has a plurality of the tab 25a, 25b which are respectively positioned in proximity to the portion where the top surface 23 and the bottom surface 24 are assembled with the attachment surface 22. The clips 15a, 15b of the modular housings 10 are respectively used to hook over the tab 25a, 25b.

Referring to FIG. 3, the clips 15a are snap hooks according to this embodiment of the present invention, and the clips 15a are bended and extend from the first side plate 12 along the assembling direction A and are higher than the first side plate 12. Each of the clips 15a has a hook block 151. The hook structures 16a are fixing ring structures and extend from the first side plate 12, and the hook structures 16a have holes 161. When the modular housings 10 are assembled each other, the clips 15a are inserted into the holes 161 of the hook structures 16a, and the hook blocks 151 are hooked by the hook structures 16a so that the clips 15a are hooked by the hook structures 16a.

Both the tab 25a and the hook structures 16a may have same structures so that the clips 15a are hooked by the tab 25a when the modular housings 10 are assembled with the base housing 20.

Referring to FIG. 4, the clips 15b are fixing ring structures according to this embodiment of the present invention, and the clips 15b extend from the edge of the second side plate 13 along the assembling direction A and the second side plate 13 has a hook hole 152. Each of the hook structures 16b has a tongue 162 and a hole 163, and the tongues 162 extend from the second side plate 13 and are higher than the second side plate 13. The holes 163 are positioned at the second side plate 13. When the modular housings 10 are assembled each other, the tongues 162 of the hook structures 16b are inserted into the hook holes 152 of the clips 15b. The clips 15b are received at the holes 163, and the hook structures 16b are bended along a direction which is opposite to the assembling direction A so that the clips 15b are hooked by the hook structures 16b.

Both the tab 25b and the hook structures 16b may have same structures so that the clips 15b are hooked by the tab 25b when the modular housings 10 are assembled with the base housing 20.

Figure 5:
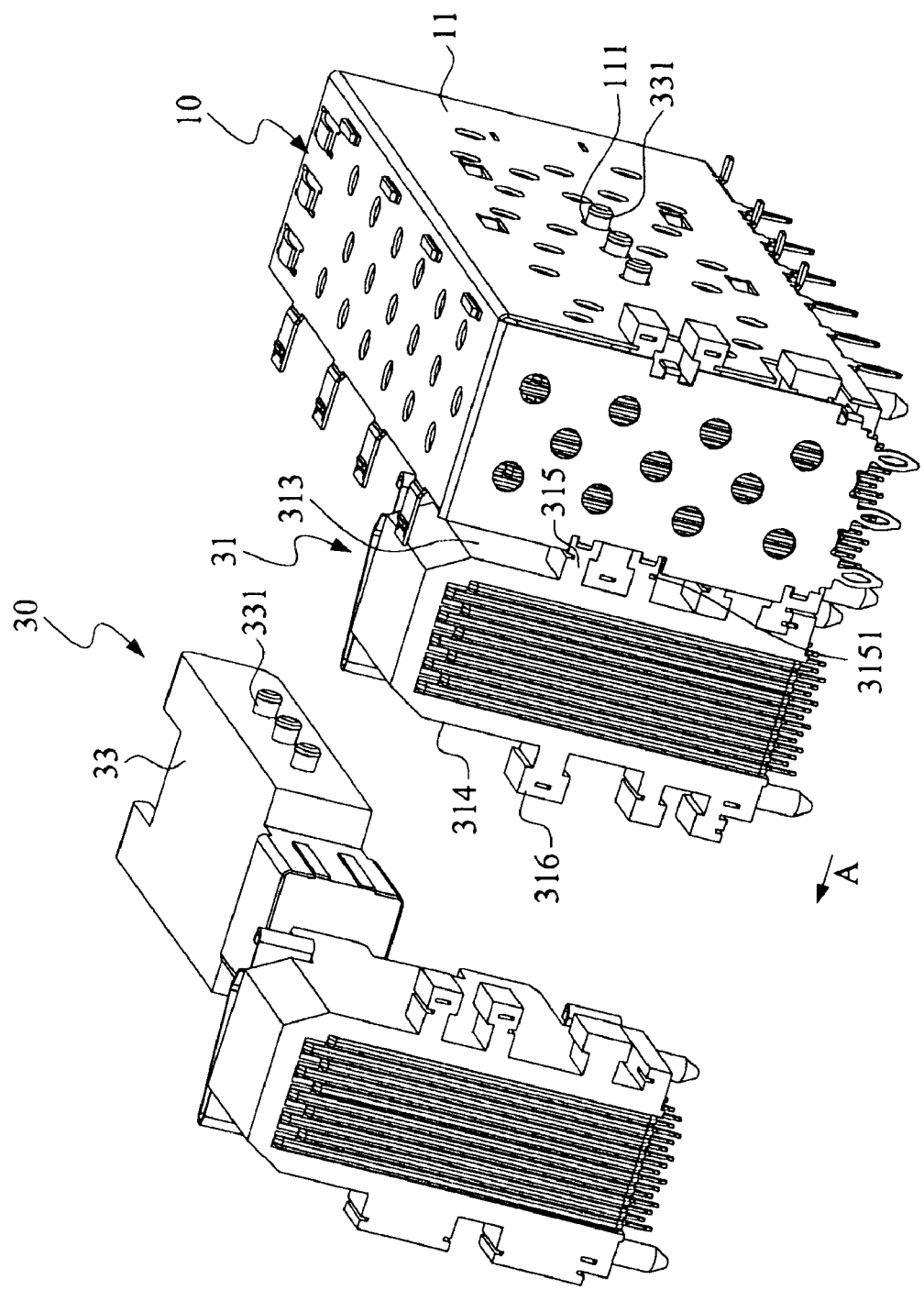
FIG. 5 is a partly exploded view of an expendable electrical connector of FIG. 1.

Referring to FIG. 5, it illustrates a partly exploded view of an expendable electrical connector of the present invention. The insulation body 31 includes a first connection surface 313, and a second connection surface 314 which is opposite to the first connection surface 313 (referring to FIG. 2). The first connection surface 313 has a first connection structure 315, and the second connection surface 314 has a second connection structure 316. The first connection structure 315 is positioned opposite to the second connection structure 316. When the receptacle assemblies 30 are sequentially assembled along the direction A (refer to FIG. 2), the first connection structure 315 of one of the insulation bodies 31 is assembled with the second connection structure 316 of another one of the insulation bodies 31.

The first connection structure 315 has at least one guide groove 3151 which are positioned along the assembling direction A1, and each of the modular housings 10 is guided and held by the guide grooves 3151 so as to firmly hold the modular housings 10.

Figure 6:
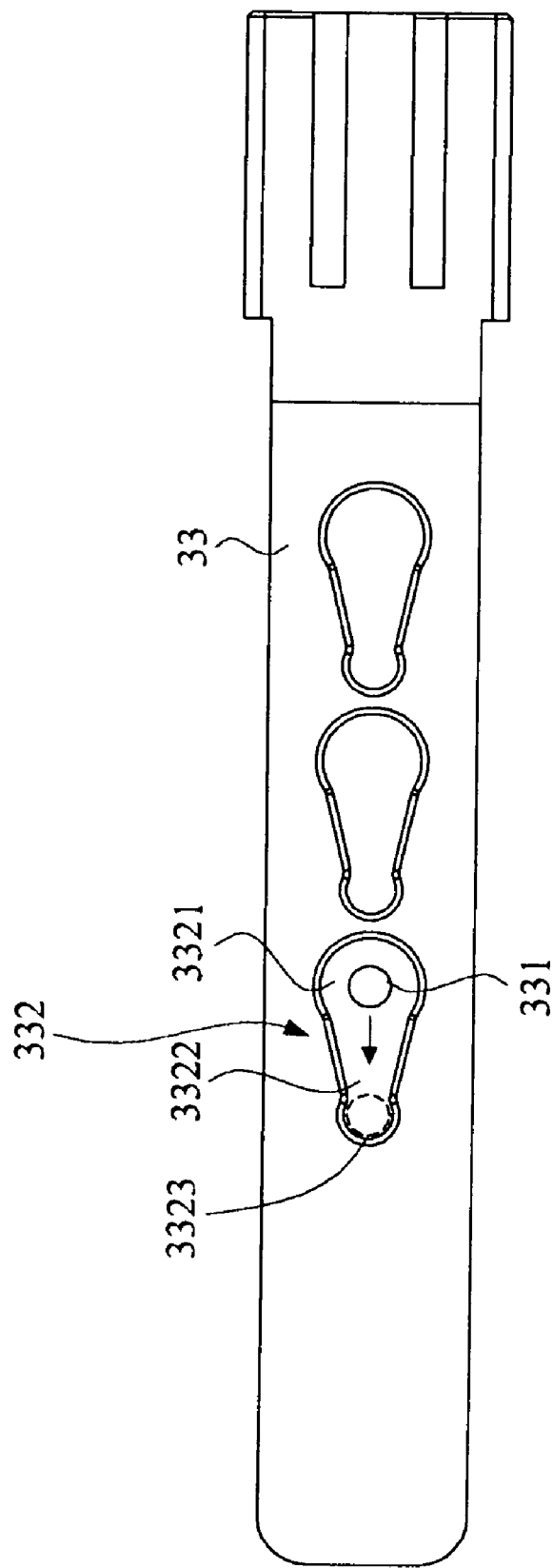
FIG. 6 is a plan view of a division element of the present invention.

Referring to FIGS. 5 and 6, FIG. 6 schematically illustrates the division element 33 of the present invention. At least one retention structure 331 are positioned at one side of the division element 33 and a cylindrical structure. A retention groove 332 is positioned at the other side of the division element 33 (refer to FIG. 2), and a plurality of retention holes 111 are positioned at the attachment plate 11 of the modular housing 10. When the division element 33 is positioned at the modular housing 10, the division element 33 exposes out of the retention hole 111 of the modular housing 10. When the receptacle assemblies 30 are assemblies along the assembling direction A (refer to FIG. 2), the retention structures 331 of one of the division elements 33 are positioned at the retention grooves 332 of another one of the division elements 33.

Referring to FIG. 6, it schematically illustrates the division element 33 of the present invention. The retention groove 332 has a receiving portion 3321, an interference portion 3322, and a retention portion 3323. When the retention structure 331 is positioned at the retention groove 332, the retention structure 331 is received within the receiving portion 3321 and moved toward the retention portion 3323. And, when the retention structure 331 is received within the retention portion 3323, the interference portion 3322 is used to prevent the retention structure 331 from moving with respect to the retention portion 3323.

Figure 7:
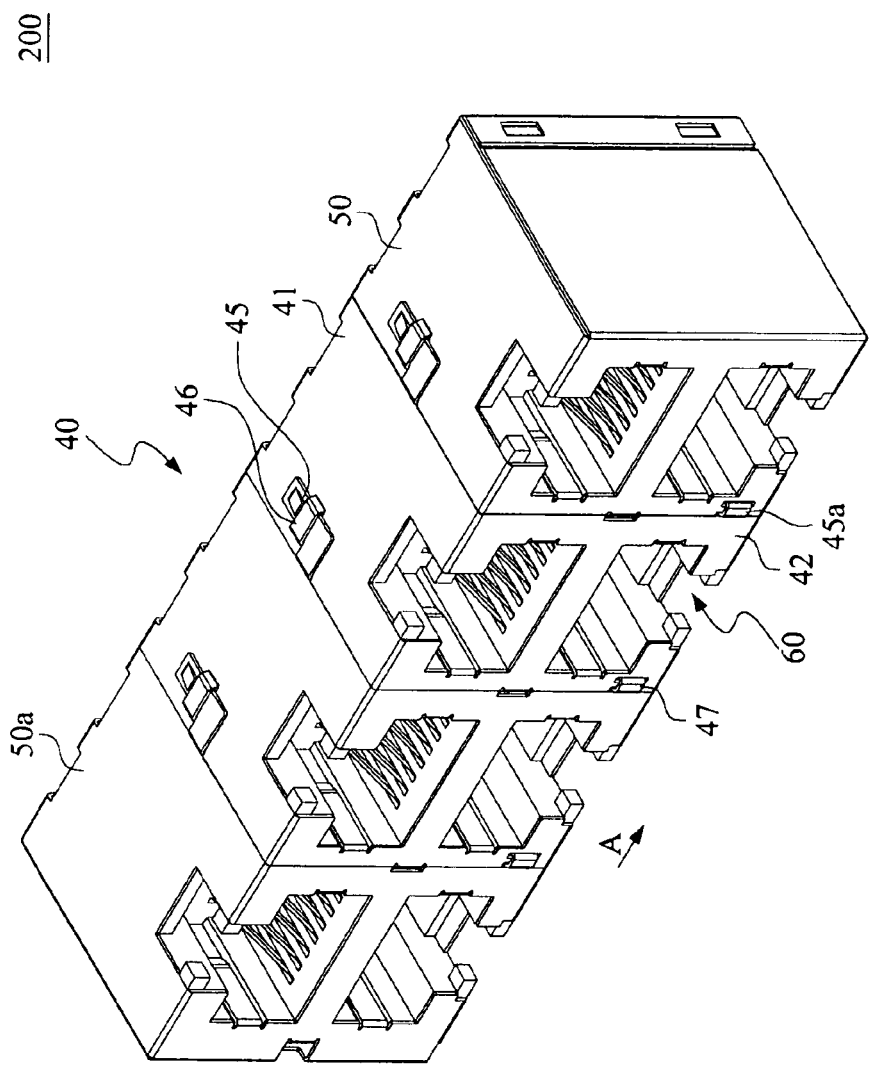
FIG. 7 is a perspective view of an expendable electrical connector of the second embodiment according to the present invention.
Figure 8:
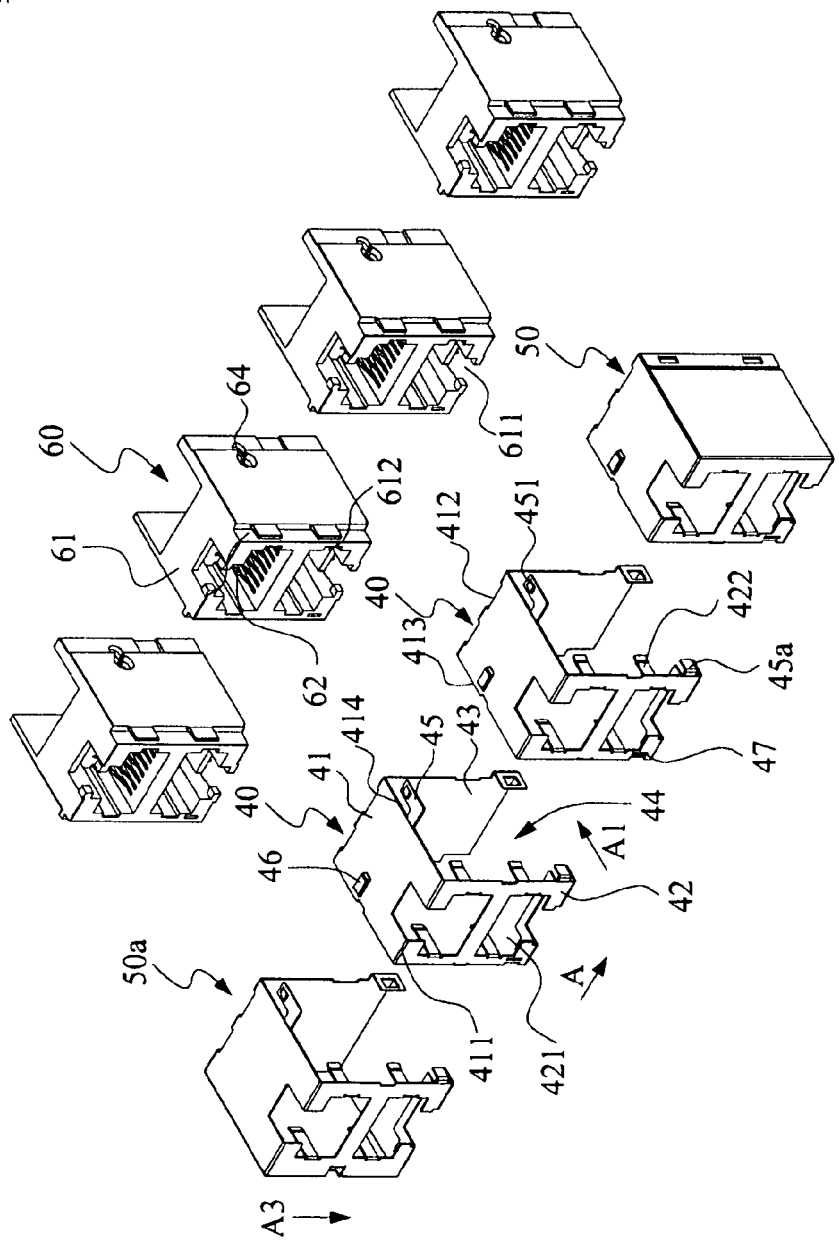
FIGS. 8 and 9 are partly exploded views of an expendable electrical connector of the second embodiment according to the present invention.
Figure 9:
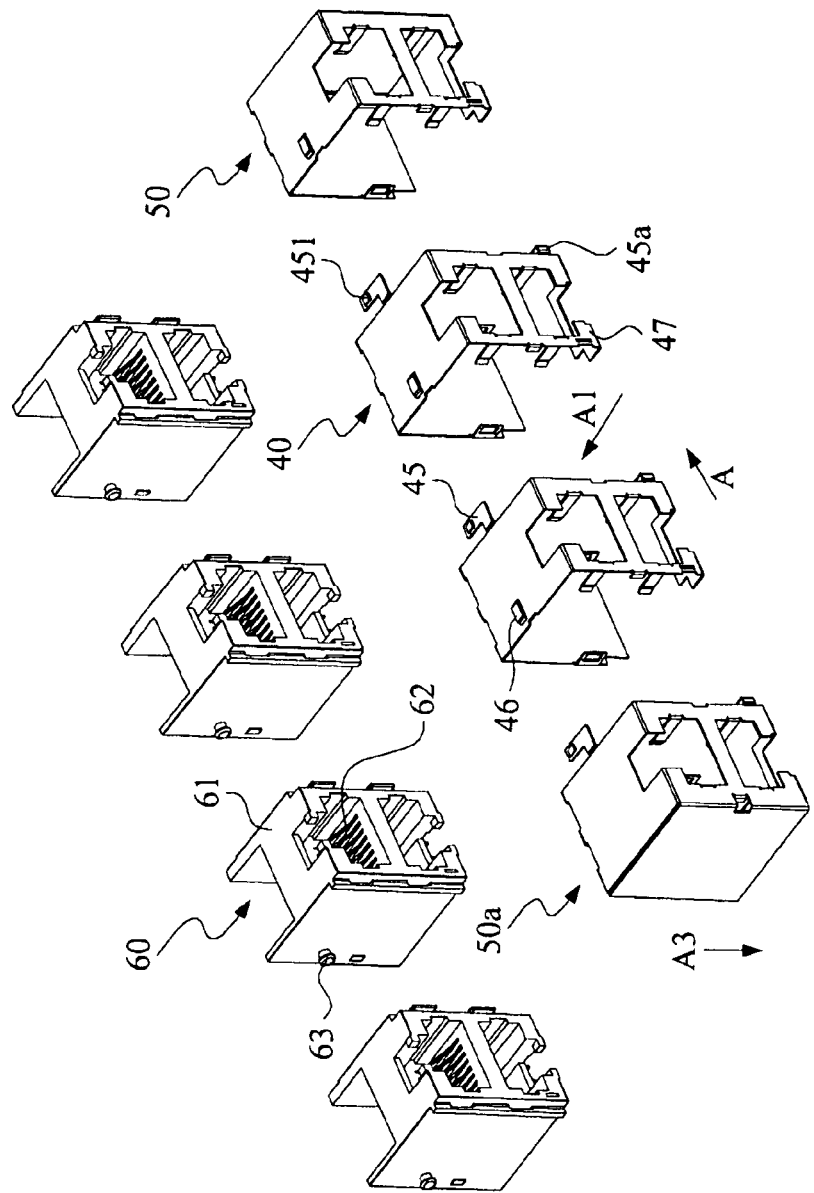

Referring to FIG. 7-9, FIG. 7 is a perspective view of an expendable electrical connector 200 of the second embodiment according to the present invention, and FIGS. 8 and 9 are partly exploded views of an expendable electrical connector 200 of the second embodiment according to the present invention.

The expendable electrical connector 200 has a plurality of modular housings 40, two base housings 50, 50a and a plurality of receptacle assemblies 60. The modular housings 40 are sequentially assembled along the assembling direction A, and are made of metallic plate by punching process. Each of the modular housings 40 includes an attachment plate 41, a first side plate 42, and a second side plate 43, and a plurality of clips 45, 45a and at least one hook structure 46. The attachment plate 41 includes a first extension side 411, a second extension side 412, a first assembly side 413, and a second assembly side 414. The second assembly side 414 is opposite to the first assembly side 413. The first assembly side 413 and the second assembly side 414 extends perpendicular to the assembling direction A or along the inserting direction A1. When the modular housings 40 are sequentially assembled along the assembling direction A, the first assembly side 413 of one of the modular housings 40 is positioned in proximity to or in contact with the second assembly side 414 of another one of the modular housings 40.

The second extension side 412 is opposite to the first extension side 411, and both the first extension side 411 and the second extension side 412 extend along the assembling direction A. The first side plate 42 extends along the first extension side 411 and the extending direction A3, and the second side plate 43 extends along the second extension side 412 and the extending direction A3.

When the modular housings 40 are sequentially assembled along the assembling direction A, a receiving space 44 is formed by the attachment plate 41, the first side plate 42, and a second side plate 43. The receiving spaces 44 of the modular housings 40 are in communication with each other. The one sides of the attachment plate 41, the first side plate 42 and the second side plate 43 of one of the modular housings 40 are respectively in proximity to the other sides of the attachment plate 41, the first side plate 42 and the second side plate 43 of another one of the modular housings 40. The first side plate 42 has at least one insertion hole 421 for receiving a pair of receptacle modules or plugs.

Both the clips 45 and the hook structure 46 may be positioned at the attachment plate 41, and the clips 45 and the hook structure 46 may be positioned at the first side plate 42 or the second side plate 43 according to another embodiment of the present invention. When the modular housings 40 are sequentially assembled along the assembling direction A, the clip 45 of one of the modular housings 40 is used to hook over the hook structure 46 of another one of the modular housings 40.

The clips 45 are snap hooks according to this embodiment of the present invention, and the clips 45 are bended from the attachment plate 41 and extend along the inserting direction A1 and are higher than the attachment plate 41. Each of the clips 45 has a hook block 451. The hook structures 46 are fixing ring structures and extend from the top surface of the attachment plate 41. When the modular housings 40 are assembled each other, the clips 45 are inserted into the hook structures 46, and the hook blocks 451 are hooked by the hook structures 46 so that the clips 45 are hooked by the hook structures 46.

The clips 45a are snap hooks according to this embodiment of the present invention, and the clips 45a are bended from the attachment plate 41 and extend along the inserting direction A1. The hook structures 46 may be positioned at the first side plate 42, and may be holes 47. When the modular housings 40 are assembled each other, the clips 45a are inserted into the holes 47, and the clips 45a are hooked by the holes 47 so that the clips 45a are hooked by the hook structures 46.

The base housings 50, 50a may be assembled with the modular housings 40, and when the modular housings 40 are sequentially assembled, the base housings 50, 50a are respectively assembled with two ends of the modular housings 40.

The receptacle assemblies 60 are sequentially assembled along the assembling direction A, the receptacle assemblies 60 are respectively assembled with the receiving space 44 of the modular housings 40. Each of the receptacle assemblies 60 includes an insulation body 61 and a plurality of terminals 62 which are positioned within the insulation body 61.

The insulation body 61 includes a plurality of slots 611 corresponding to the guiding hole 412 of the first side plate 42 for receiving a pair of receptacle modules or plugs. At least one retention groove 612 is positioned at the insulation body 61 and extends along the inserting direction A1. A clip 422 is positioned at the first side plate 42 of the modular housings 40, and can be a snap hook or a rod structure. The clip 422 extends along the inserting direction A1. When the modular housing 40 is positioned at the insulation body 61, the clip 422 is assembled with the retention groove 612.

At least one retention structure 63 is positioned at one side of the insulation body 61, and at least one retention groove 64 is positioned at the other side of the insulation body 61. When the receptacle assemblies 60 are sequentially assembled along the assembling direction A, the retention structure 63 of the one of the insulation bodies 61 is positioned within the retention groove 64 of another one of the insulation bodies 61. The retention groove 64 and the retention structure 63 are equivalent to the slot 311 and the retention groove 332 of FIG. 6.

To sum up, advantage of the present invention is that a plurality of modular housing are sequentially assembled for receiving receptacle assemblies. The present invention does not use dedicated moulds for different numbers of the receptacle assemblies and cost is decreased. Two neighboring modular housings share a side plate so that total length of the expendable electrical connector will be shortened and cost of modular housings will also be decreased. Each of the modular housings may be made from a metallic sheet by punching process, and used to cover each of the receptacle assemblies and the modular housings can be connected with each other. The modular housings of the present invention provides a good performance of grounding and shielding electromagnetic interference without dedicated grounding steps for individual receptacle assemblies.

While the invention has been described with reference to the preferred embodiments, the description is not intended to be construed in a limiting sense. It is therefore contemplated that the appended claims will cover any such modifications or embodiments as may fall within the scope of the invention defined by the following claims and their equivalents.

What is claimed is:

1. An expendable electrical connector, comprising:
   a plurality of receptacle assemblies each having an insulative body; and
   a plurality of conductive modular housings sequentially assembled along an assembling direction, each of the conductive modular housings including:
   a substantially planar conductive attachment plate having first and second opposite edges;
   a first side plate extending at said first edge of said conductive attachment plate substantially perpendicular thereto toward a first end of said first plate along the assembling direction; and
   a second side plate extending at said second edge of said attachment conductive plate substantially perpendicular thereto toward a second end of said second plate along the assembling direction so that an assembly opening is defined by the first and second side plates;
   wherein said each modular housing and a neighboring one of said plurality of the conductive modular housings are coupled each to the other to result in a hollow receiving structure defined therebetween, wherein a respective one of said plurality of receptacle assemblies is received within said hollow receiving structure,
   wherein, upon said each conductive modular housing is coupled at said first and second ends of said first and second side plates thereof, respectively, to said first and second edges of said attachment plate of said neighboring conductive modular housing, said hollow receiving structure is enveloped by said conductive attachment plate and said first and second side plates of said each modular housing and said conductive attachment plate of said neighboring modular housing, each said conductive modular housing has a plurality of clips and a plurality of hook structures, said clips of each said conductive modular housing being hooked over the hook structures of said neighboring conductive modular housing
   wherein the first side plate of said each modular housing has a first assembly edge in proximity to the attachment plate, wherein the clips are positioned in proximity to the first end, and wherein the hook structures are positioned in proximity to the first assembly edge.

2. The expendable electrical connector as claimed in claim 1, wherein the clips are snap hooks and the hook structures are fixing ring structures, and wherein the clips are inserted into the hook structures, wherein the clips are hooked by the hook structures.

3. The expendable electrical connector as claimed in claim 1, wherein the clips are fixing ring structures and each of the hook structures has a tongue and a hole, wherein the tongues are inserted into the clips received at the holes, and wherein the clips are hooked by the hook structures.

4. The expendable electrical connector as claimed in claim 2, wherein the second side plate of said each modular housing has a second assembly edge in proximity to the attachment plate, wherein at least one clip is positioned in proximity to the second end, and at least one hook structure is positioned in proximity to the second assembly edge.

5. The expendable electrical connector as claimed in claim 1, wherein the base housing is a hollow rectangular prism.

6. The expendable electrical connector as claimed in claim 1, wherein the housing has an attachment surface which is attached to an assembly opening of another one of the modular housings.

7. The expendable electrical connector as claimed in claim 6, wherein the attachment surface of the housing is assembled with the attachment plate, the first side plate and the second side plate of another one of the modular housings so that a hollow rectangular prism is formed.

8. The expendable electrical connector as claimed in claim 1, wherein the housing has a plurality of the tabs, and the modular housing has a plurality of clips, and the clips of the modular housing are respectively used to hook over the tabs.

9. The expendable electrical connector as claimed in claim 1, further comprising a plurality of receptacle assemblies respectively positioned within the housing and the modular housings when the modular housings are sequentially assembled along the assembling direction.

10. The expendable electrical connector as claimed in claim 1, further comprising a plurality of receptacle assemblies respectively positioned within the modular housings.

11. The expendable electrical connector as claimed in claim 10, wherein the receptacle assemblies are sequentially assembled along the assembling direction.

12. The expendable electrical connector as claimed in claim 11, wherein each of the receptacle assemblies includes an insulation body which includes a first connection surface and a second connection surface which is opposite to the first connection surface, and the first connection surface has a first connection structure, and the second connection surface has a second connection structure, and when the receptacle assemblies are assembled along the assembling direction, the first connection structure of one of the insulation bodies is assembled with the second connection structure of another one of the insulation bodies.

13. The expendable electrical connector as claimed in claim 12, wherein each of the receptacle assemblies includes a plurality of terminals which are positioned within the insulation body.

14. The expendable electrical connector as claimed in claim 10, wherein each of the receptacle assemblies includes an division element, and at least one retention structure is positioned at one side of the division element, and at least one retention groove is positioned at the other side of the division element, and when the receptacle assemblies are sequentially assembled along the assembling direction, the retention structure of the one of the division element is positioned within the retention groove of another one of the division element.

15. The expendable electrical connector as claimed in claim 14, wherein the retention groove has an interference portion which is used to prevent the retention structure from moving.

16. An expandable electrical connector, comprising:

a plurality of conductive modular housings sequentially assembled along a assembling direction, wherein each of the conductive modular housings includes:

a conductive attachment plate, a first side plate extend in perpendicular from a first edge of the conductive attachment plate toward a first end along the assembling direction, and a second side plate extending perpendicular from a second edge of the conductive attachment plate toward a second end along the assembling direction, an assembly opening being defined by the first and the second side plates, wherein the conductive attachment plate of a respective one of said plurality of the conductive modular housings is assembled with the assembly opening of a neighboring one of said plurality of the modular housings; and a plurality of receptacle assemblies, each of said receptacle assemblies having an insulative housing and being positioned within a respective one of said plurality of modular housings;

wherein each of the receptacle assemblies includes a division element, and at least one projected retention structure positioned at one side of the division element, and at least one retention groove defined at the other side of the division element, wherein when the receptacle assemblies are sequentially assembled along the assembling direction, the projected retention structure of one of the division elements is positioned within the retention groove of a neighboring division element.

17. The expendable electrical connector as claimed in claim 16, wherein the retention groove has an interference portion preventing the retention structure from moving.

* * * * *